US010781517B1

(12) United States Patent
Dwivedi (10) Patent No.: US 10,781,517 B1
(45) Date of Patent: *Sep. 22, 2020

(54) MODIFICATION OF RADIATOR PIGMENTS USING ATOMIC LAYER DEPOSITION (ALD) OF THERMAL PROTECTIVE FILM MATERIAL

(71) Applicant: United States of America as represented by the Administrator of NASA, Washington, DC (US)

(72) Inventor: Vivek H. Dwivedi, Glenn Dale, MD (US)

(73) Assignee: United States of America as represented by the Administrator of NASA, Washington, DC (US)

( * ) Notice: Subject to any disclaimer, the term of this patent is extended or adjusted under 35 U.S.C. 154(b) by 49 days.

This patent is subject to a terminal disclaimer.

(21) Appl. No.: 16/144,242

(22) Filed: Sep. 27, 2018

Related U.S. Application Data

(63) Continuation-in-part of application No. 15/875,092, filed on Jan. 19, 2018, now Pat. No. 10,392,263.

(51) Int. Cl.
| | | |
|---|---|---|
| *C23C 16/40* | (2006.01) | |
| *C23C 16/455* | (2006.01) | |
| *C09C 3/06* | (2006.01) | |
| *C23C 16/44* | (2006.01) | |
| *C23C 16/56* | (2006.01) | |

(52) U.S. Cl.
CPC ........ *C23C 16/45555* (2013.01); *C09C 3/063* (2013.01); *C23C 16/405* (2013.01); *C23C 16/4417* (2013.01); *C23C 16/45527* (2013.01); *C23C 16/45544* (2013.01); *C23C 16/45553* (2013.01); *C23C 16/56* (2013.01)

(58) Field of Classification Search
CPC ....... C01G 31/02; C09C 1/0015; C09C 3/063; C23C 16/40
See application file for complete search history.

(56) References Cited

U.S. PATENT DOCUMENTS 6,241,858 B1 * 6/2001 Phillips ................. C09C 1/0021
118/716
7,820,088 B2 * 10/2010 Josephy ................. C09D 7/70
264/81

(Continued)

FOREIGN PATENT DOCUMENTS

WO 00/24946 * 5/2000 ............. C23C 14/00

OTHER PUBLICATIONS

Abegunde, Olayinka Oluwatosin, et al., Review "Overview of thin film deposition techniques". AIMS Materials Science, vol. 6, Issue 2, 174-199, Mar. 13, 2019.*

Wang, Ben, et al., Review "Simulation and Optimization of Film Thickness Uniformity in Physical Vapor Deposition." Coatings 2018, 8, 325, pp. 1-27. doi:10.3390/coatings8090325.*

(Continued)

*Primary Examiner* — Bret P Chen
(74) *Attorney, Agent, or Firm* — Matthew F. Johnston; Bryan A. Geurts; Helen M. Galus (57) ABSTRACT

Modification of pigments may be performed using atomic layer deposition (ALD) to provide custom-tailored thermal protection characteristics. More specifically, ALD may be used to encapsulate pigment particles with controlled thicknesses of a thermal protective layer, such as $VO_2$. ALD may allow films to be theoretically grown one atom at a time, providing angstrom-level thickness control.

20 Claims, 6 Drawing Sheets

(56) References Cited

U.S. PATENT DOCUMENTS

| | | | | |
|---|---|---|---|---|
| 10,392,263 | B1* | 8/2019 | Dwivedi | C09C 1/00 |
| 2007/0207266 | A1* | 9/2007 | Lemke | B01J 2/006 |
| | | | | 427/212 |
| 2007/0298250 | A1* | 12/2007 | Weimer | C23C 16/45525 |
| | | | | 428/336 |
| 2009/0011145 | A1* | 1/2009 | Yun | C23C 16/405 |
| | | | | 427/569 |
| 2015/0290713 | A1* | 10/2015 | Olejnik | C09C 1/64 |
| | | | | 424/61 |
| 2015/0376785 | A1* | 12/2015 | Knaapen | C23C 16/45551 |
| | | | | 427/557 |
| 2016/0079604 | A1* | 3/2016 | Atanasoski | H01M 4/8814 |
| | | | | 429/524 |
| 2016/0164135 | A1* | 6/2016 | Fasching | H01M 4/136 |
| | | | | 429/319 |

OTHER PUBLICATIONS

Schneider, Thomas, et al., "Combined Single-Drop and Rotating Drum Dustiness Test of Fine to Nanosize Powders Using a Small Drum". Ann. Occup. Hyg., vol. 52, No. 1, pp. 23-34, 2008.*

Sharma, Kashish, et al., "Spatial atomic layer deposition on flexible substrates using a modular rotating cylinder reactor". J. Vac. Sci. Technol. A 33(1), Jan./Feb. 2015, 01A132-1 to 01A132-8.*

Dwivedi, Vivek H., et al., "Modification of Radiator Pigments by Atomic Layer Deposition (ALD)". Goddard Space Flight Center Presentation, pp. 1-23. No date available.*

Dwivedi, Vivek H., et al., "Technology Development for the Modification of High Aspect Ratio Geometries for Thermal and Environmental Control". 49th International Conference on Environmental Systems ICES-2019-22 Jul. 7-11, 2019, Boston, Massachusetts, pp. 1-9.*

* cited by examiner

MODIFICATION OF RADIATOR PIGMENTS USING ATOMIC LAYER DEPOSITION (ALD) OF THERMAL PROTECTIVE FILM MATERIAL

CROSS-REFERENCE TO RELATED APPLICATION

This application is a continuation-in-part (CIP) of U.S. Nonprovisional application Ser. No. 15/875,092 filed Jan. 19, 2018, which matured into U.S. Pat. No. 10,392,263. The subject matter of this earlier filed application is hereby incorporated by reference in its entirety.

STATEMENT OF FEDERAL RIGHTS

The invention described herein was made by employees of the United States Government and may be manufactured and used by or for the Government for Government purposes without the payment of any royalties thereon or therefore.

FIELD

The present invention generally relates to radiators, and more specifically, to modification of radiator pigments using atomic layer deposition (ALD) of a thermal protective film material that changes its crystalline structure at a certain temperature, such as vanadium dioxide ($VO_2$).

BACKGROUND

Stable white thermal control coatings are used on radiators for a variety of missions. The optical and physical properties of spacecraft radiator coatings are dictated by orbital environmental conditions. The two most commonly used dissipative thermal coatings (Z93C55 and AZ2000) rely on indium oxide or tin oxide as charge dissipative additives.

As miniaturized science platforms continue to be an integral part of NASA's missions in the form of CubeSats, thermal control methodologies are needed that do not overly burden the mass and power budget while allowing for an extended mission lifespan. The temperature of a satellite is controlled corresponding to the requirements for the payload and the platform. Launch cost is proportional to the mass of the satellite, and is thus the largest development driver. Typical thermal control systems including heat pipes and radiators are large and heavy. Accordingly, an improved thermal control system and methodology may be beneficial.

SUMMARY

Certain embodiments of the present invention may provide solutions to the problems and needs in the art that have not yet been fully identified, appreciated, or solved by conventional pigment and coating technologies. For example, some embodiments pertain to modification of radiator pigments using ALD to encapsulate pigment particles in a thin "shell" of a thermal film material that changes its crystalline structure at a certain temperature, such as $VO_2$. In the temperature range for space thermal film applications, which is ideally between 0-70° C. in some embodiments, $VO_2$ is the best known material due to its undoped crystalline structure change at 68° C., and the potential to lower this via doping.

In an embodiment, a method includes loading powder pigment into a rotating drum and loading the rotating drum into a vacuum chamber of an ALD reactor. The method also includes evacuating air from the rotating drum and beginning rotation of the rotating drum. The method further includes pulsing a liquid vanadium precursor into the rotating drum with a sufficiently low vapor pressure that the vanadium precursor vaporizes in the rotating drum, marinating the powder pigment with the vaporized vanadium precursor for a first time period, and then purging the vaporized vanadium precursor. Additionally, the method includes pulsing an oxygen source into the rotating drum, marinating the powder pigment coated with the vaporized vanadium precursor for a second time period, and purging the oxygen precursor, resulting in a coating of $VO_2$ on particles of the powder pigment.

In another embodiment, a method includes pulsing a liquid vanadium precursor into a rotating drum under vacuum conditions, the liquid vanadium precursor having a sufficiently low vapor pressure that the vanadium precursor vaporizes in the rotating drum, marinating the powder pigment with the vaporized vanadium precursor for a first time period, and then purging the vaporized vanadium precursor. The method also includes pulsing an oxygen source into the rotating drum, marinating the powder pigment coated with the vaporized vanadium precursor for a second time period, and purging the oxygen precursor, resulting in a coating of $VO_2$ on particles of the powder pigment.

In yet another embodiment, a method includes pulsing a liquid vanadium precursor into a rotating drum under vacuum conditions, the liquid vanadium precursor having a sufficiently low vapor pressure that the vanadium precursor vaporizes in the rotating drum, marinating the powder pigment with the vaporized vanadium precursor for a first time period, and then purging the vaporized vanadium precursor. The method also includes pulsing an oxygen source into the rotating drum, marinating the powder pigment coated with the vaporized vanadium precursor for a second time period, and purging the oxygen precursor. The method further includes pulsing a dopant into the rotating drum, marinating the $VO_2$ coated powdered pigment for a third time period, and purging the dopant, resulting in a doped coating of $VO_2$ on particles of the powder pigment that changes from a semiconductor crystalline structure to a metal crystalline structure at a temperature of less than 68° C. that is defined based on application requirements.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE EMBODIMENTS

Some embodiments pertain to modification of radiator pigments using ALD to encapsulate pigment particles in a thin "shell" of a material that changes its crystalline structure at a certain temperature, such as $VO_2$. More specifically, in some embodiments, ALD is used to encapsulate pigment particles with controlled thicknesses of a thermal film, such as $VO_2$. ALD may allow films to be theoretically grown one atom at a time, providing angstrom-level thickness control. Multilayered thermal films based on $VO_2$ as smart radiator devices (SRD) may provide critical functional thermal control surfaces that decrease the overall spacecraft power budget by being lightweight and passive. Such encapsulated pigments may provide thermal protection for spacecraft of any size, windows, energy-efficient homes, or any other suitable vehicle, structure, or object, whether space-based or terrestrial (including on other planets and space bodies, such as asteroids and moons), without deviating from the scope of the invention.

$VO_2$ has a unique property of changing its crystalline structure from a semiconductor to a metal at a specific temperature and with a specific emissivity. More specifically, in undoped $VO_2$, this transition occurs at 68° C., with the emissivity changing from e=0.4 to e=0.9. In other words, the emissivity increases, which causes more thermal radiation to be emitted after $VO_2$ changes to a metal. $VO_2$ may also be doped with a suitable dopant including, but not limited to, tungsten or niobium oxide. This lowers the temperature at which the transition to a metal occurs.

By coating the pigment first before the pigment is mixed with a wet binder to be sprayed on the radiator, passive thermal protection may be provided. Current techniques would require the entire radiator to be coated. This is not practical since it results in large geometries. More specifically, vacuum chambers would need to be constructed that can house the overall dimension of the radiator. Instead, some embodiments coat the pigment first, allowing the geometry to be ignored for this purpose. The coating rather than the radiator substrate/structure is thus the focus of some embodiments.

Atomic Layer Deposition

ALD is cost-effective, nanoadditive manufacturing technique that allows for the conformal coating of substrates with atomic control in a benign temperature and pressure environment. Through the introduction of paired precursor gases, thin films can be deposited on a myriad of substrates—from flat surfaces to those with significant topography. By providing atomic layer control, where single layers of atoms can be deposited, the fabrication of metal transparent films, precise nano-laminates, and coatings of nano-channels and pores is achievable.

Figure 1:
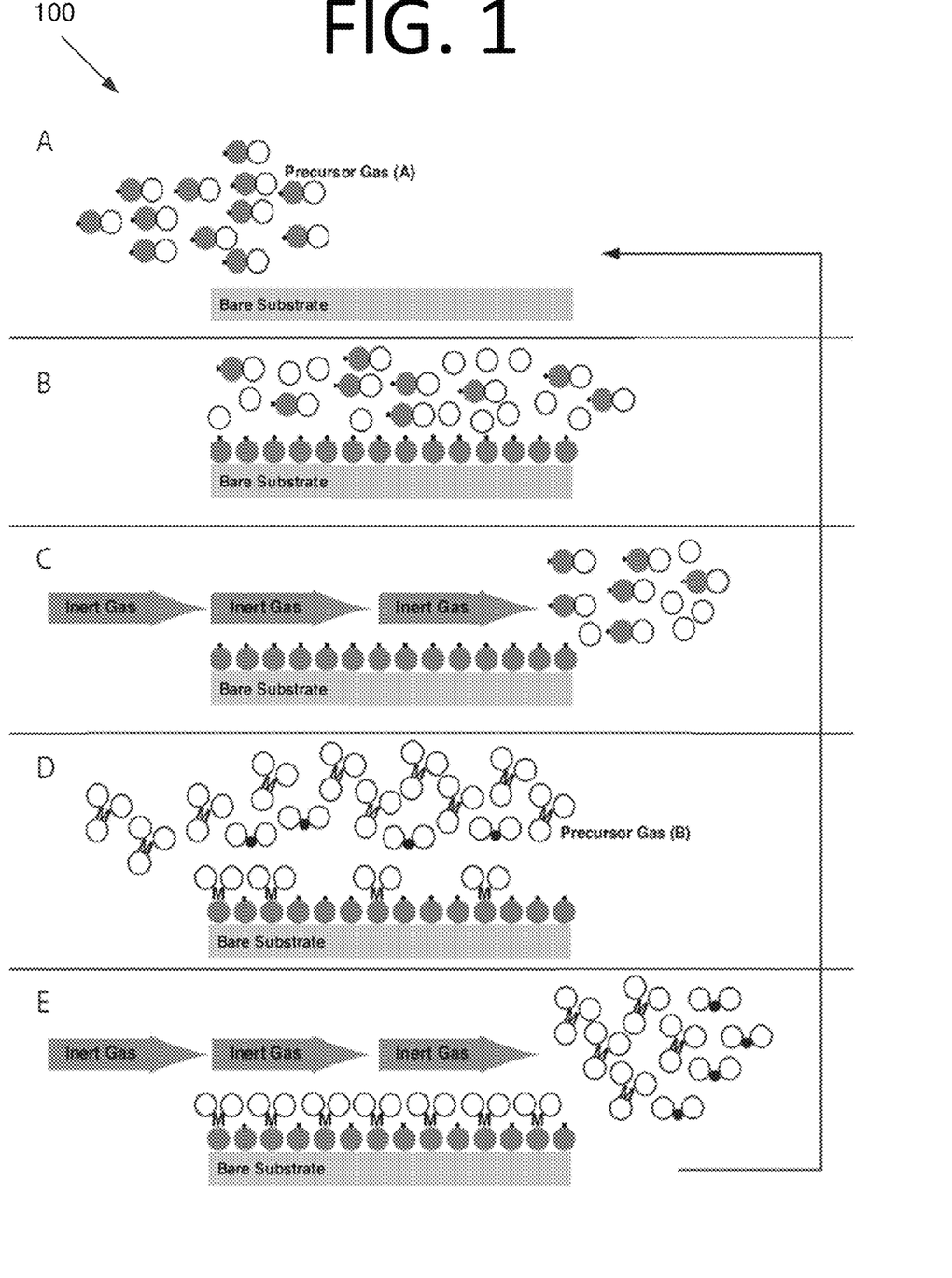
FIG. 1 illustrates an ALD process.

A characteristic of the surface adsorption and reaction mechanisms in ALD is that they are normally self-limiting, allowing for atomically accurate control of nanometer (nm) thickness. Coated particles can be uniformly deposited on a myriad of substrates, ranging from glass, polymers, aerogels, and metals to high aspect ratio geometries. Therefore, high uniformity and precise thickness control make ALD an attractive process for the creation of novel optical and other nano-scale devices. Thin films grown by ALD use alternating pulses of precursor gases, where traditionally, each gas contributes either a metal atom to the film or an oxygen, nitrogen, or fluorine atom. An overview of the fundamental steps in the ALD manufacturing process 100 is shown in FIG. 1. Process 100 is as follows.

Step A: Precursor gas is pumped into a chamber containing a substrate.

Step B: The precursor gas chemisorbs on a substrate active site.

Step C: After a certain residence time, the excess of the reactant precursor, which is in the gas phase or has been physisorbed on the reactor chamber walls or on the substrate, is pumped out the chamber with the aid of an inert gas.

Step D: A distinct second precursor then is pumped into the reactor chamber, where it chemisorbs and undergoes an exchange reaction with the first reactant on the substrate.

Step E: This second reactant pulse results in the formation of a solid thin film. A second inert gas purge removes any excess gas from the chamber.

By repeating this cycle, controlled layer-by-layer growth is achieved. The inert gas that is pumped into the reactor between the precursor materials not only provides a separation between the precursors, but also ensures that a Chemical Vapor Deposition (CVD) type reaction does not occur in the gas phase. The separate and individual pulses of the precursors also allow this process to be scaled up to the desired dimensions of the substrate.

ALD Pigments

ALD is self-limiting because the surface reactions will terminate when reaction sites become inaccessible by depletion or by saturation with unreacted precursor ligands. An advantageous property of ALD is that the process is not line-of-sight. Rather, any exposed surface with active sites will be coated. By taking advantage of these properties of ALD, pigments or powders can be coated conformally and with atomic-level control. A wide variety of materials have been deposited (e.g., $Al_2O_3$, ZnO, Co, Pt, and Pd) on porous high surface area substrates powders and particles, such as BN, $SiO_2$, $Al_2O_3$, opals, Au, and acetaminophen. In all of these particular deposition chemistries, the metals or metal oxides/nitrides are deposited with good thickness control and with complete encapsulation of the particulate substrate.

ALD Process

Before binding of pigment, the pigment is preprocessed such that $VO_2$ is rendered directly on the coating dry pigment. Through the introduction of paired precursor gases, thin films can be deposited on a myriad of substrates ranging from glass, polymers, aerogels, metals, powders, and other high aspect-ratio microstructures and nanostructures. By providing atomic-level control, where single layers of atoms can be deposited, the fabrication of metal transparent films, precise nano-laminates, and coatings of nano-channels and pores is achievable.

In conventional approaches, only the outer surface of the pigment is coated with a charge dissipating coating in a "post-process" after the pigment coating has been applied. However, pigments are typically silicate coatings and are porous (e.g., Z93 zinc oxide-pigmented potassium silicate coatings). As such, conventional approaches only get the "peaks" of the coating surface and to not get down into the crevices of the coating. However, per the above, coatings in some embodiments are applied to pigment particles as a "pre-process" before the pigment coating is applied.

For certain applications, more thermal protection may be required and the conductive layer may be thicker. However, for other applications where thermal protection is less of an issue, the conductive coating may be thinner. This may increase reflectance, depending on the material. For instance, a thinner material may be transparent enough to allow a substrate having reflective properties to show. Thus, some embodiments enable custom tailoring of the thickness of the thermal protection layer in order to more effectively meet mission requirements.

Using ALD to deposit a thermal coating, such as $VO_2$, may have a lower impact on pigment scattering and reflectivity than existing processes due to the reduced thickness of thermal protection material that can be realized. When used in conjunction with next generation white coatings, which are extremely reflective to shorter wavelength radiation (e.g., ultraviolet), the ALD-deposited approach of some embodiments provide coatings with significantly lower solar absorptance and that are stable than current state-of-the-art coating systems. It is expected that some embodiments will reduce solar loading by greater than 40% with 70% less material than current state-of-the-art technology.

The process of the depositing of $VO_2$ via ALD includes providing a distinct pulse of the precursor(s), resulting in a $VO_2$ film. The pulse of $VO_2$ is accomplished by opening and closing pneumatic valves in some embodiments. The time in between an open and close is called a "pulse." By varying the pulse sequence, the potential emissivity of the overall $VO_2$ film structure can be controlled. This has never been performed or used before.

More specifically, the "pulse sequence" is the number, order, and duration of pulses. Per the above, in some embodiments, the $VO_2$ may be doped inn order to lower the temperature at which the transition from a semiconductor crystalline structure to a metal crystalline structure occurs. For instance, in some embodiments, a vanadium precursor, which is typically a low vapor pressure liquid (e.g., tetrakis (ethylmethylamino) vanadium (TEMAV)), is first pulsed in for a duration of time that can be denoted $t_1$, followed by an oxygen source (e.g., ozone) for a duration that can be denoted $t_2$. This is followed by a period of time $t_3$ where a dopant is introduced that binds with the $VO_2$.

A full cycle can be written as $t_1$-$t_2$-$t_3$. The number of times that this cycle is repeated provides increased overall thickness of the film that is grown. By varying the number of cycles, it is possible to vary (i.e., control) the emissivity and thickness of the overall film.

The ALD processes may be carried out in some embodiments utilizing a custom-built ALD reactor. See, e.g., ALD reactor 200 FIGS. 2A and 2B. Reactor 200 may be used to deposit and verify novel materials and precursors, for instance. One or more precursors 210 are injected into a rotating drum 220 that includes powder pigments 222. Powder pigments 222 are loaded into rotating drum 220 via a hatch (not shown), and rotating drum 220 is then loaded into a vacuum chamber 230. Rotating drum 220 is rotated by a motor 260. An isolation valve 270 (e.g., a gate valve) isolates a vacuum 272 from vacuum chamber 230, and thus also rotating drum 220. Vacuum 272 maintains reduced pressure or vacuum conditions inside vacuum chamber 230 and pumps gases out of rotating drum 220 and vacuum chamber 230 when vacuum 272 is running and isolation valve 270 is open. Isolation valve may be operated such that the pulsed gasses have a resident time within the reactor. In other words, the pulsed gasses are allowed to "marinate" inside the chamber, allowing the pigment particles to be coated.

Figure 2A:
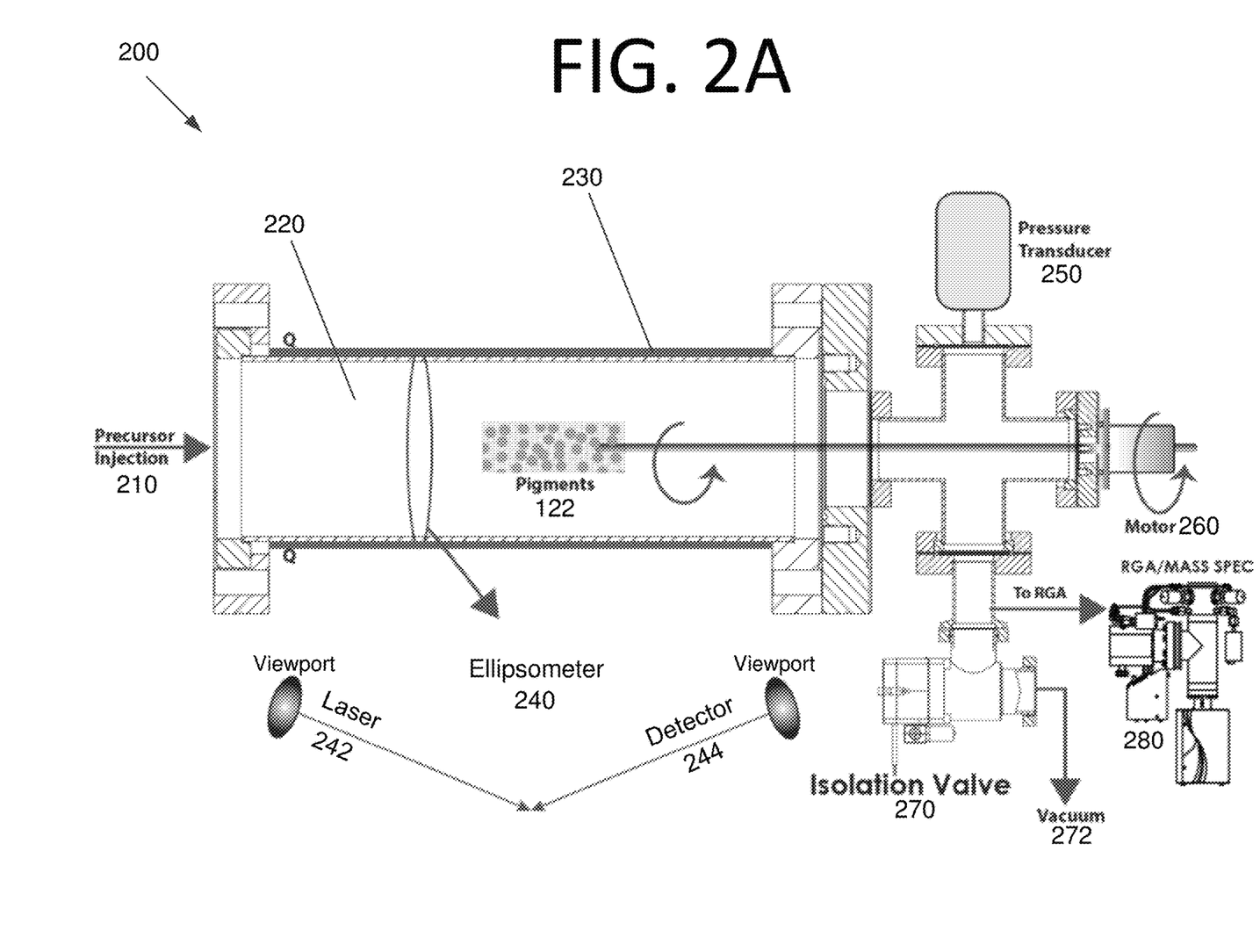
FIG. 2A is a side cutaway view illustrating an ALD reactor, according to an embodiment of the present invention.
Figure 2B:
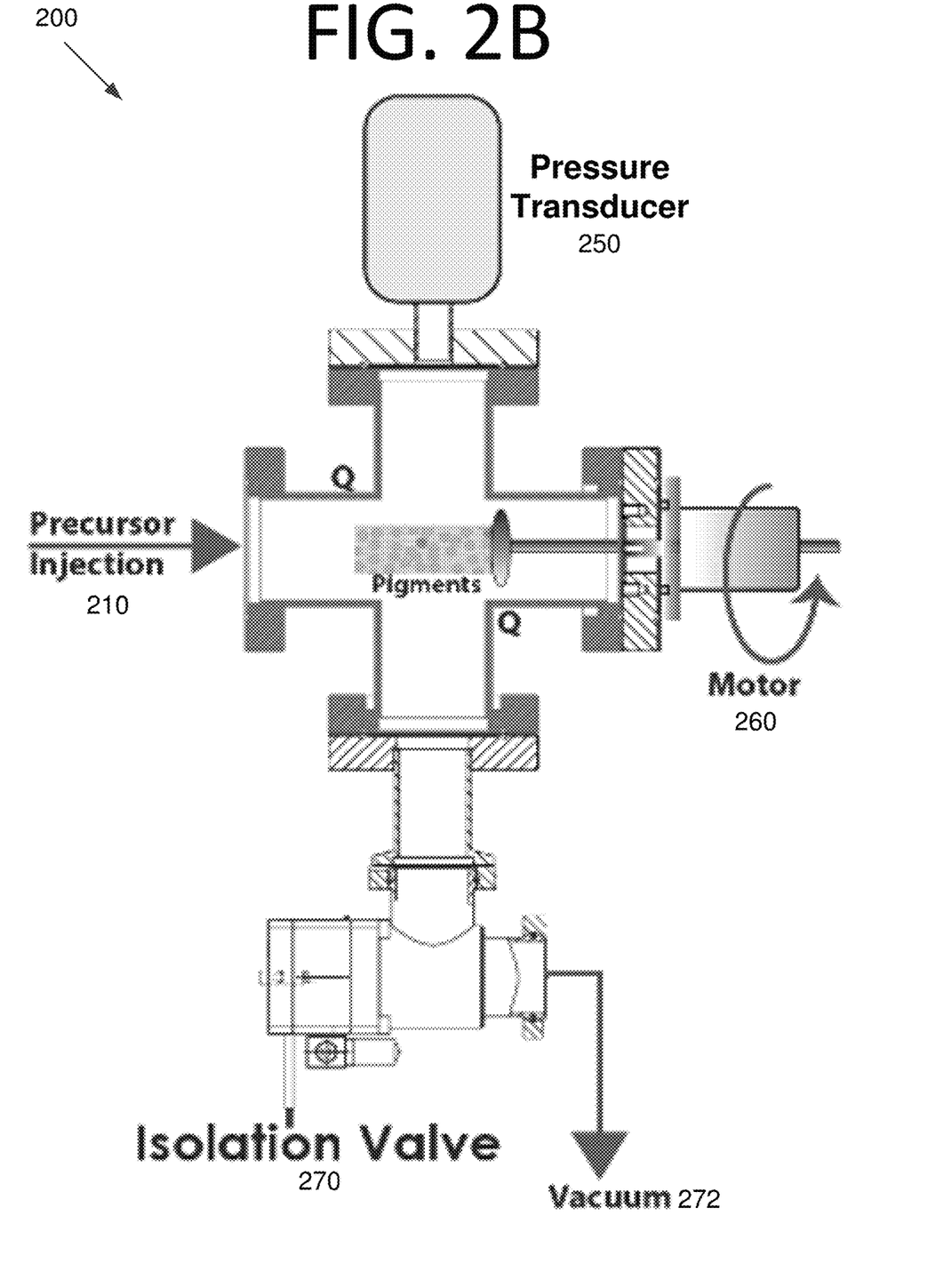
FIG. 2B is an enlarged view of the right side of the ALD reactor, according to an embodiment of the present invention.

Commercial reactors typically have preprogrammed recipes that allow for specific material deposition, and some embodiments may also be preprogrammed with desired recipes. The materials that are chosen in conventional ALD systems are typically used in the semiconductor industry, i.e., metal oxides and metals such as alumina, silicon, and hafnium oxide. As such, conventional processes differ significantly from embodiments such as that shown in FIG. 2.

A novel aspect of ALD reactor 200 is the in-situ measurement tools that are used to verify film growth. The multiple in-situ diagnostic and film growth verification tools in this embodiment include at least one upstream pressure transducer 250, an ellipsometer 240 that includes a laser 242 and a detector 244, and a downstream residual gas analyzer (RGA) and mass spectrometer 280. Each of these tools allow for an optimized process to grow films regardless of the state of the precursor, i.e., solid or liquid. Upstream pressure transducer 250 verifies the vapor pressure of each precursor, ellipsometer 240 measures film growth real time, and downstream RGA and mass spectrometer 280 verifies growth chemistries and tracks down any contaminates that may be present. Utilizing these tools, ALD reactor 200 is fundamentally designed to investigate new material systems on novel substrates, such as powders.

The ALD processing may also allow tailorable thermal protection systems to meet varying programmatic requirements. The state transition temperature may be lowered below 68° C. in order to provide the desired thermal protection. More thermally protective coating systems can be generated by increasing the thickness of the $VO_2$ layer. Fine control allows coatings of 20-40 nm in some embodiments.

Figure 3:
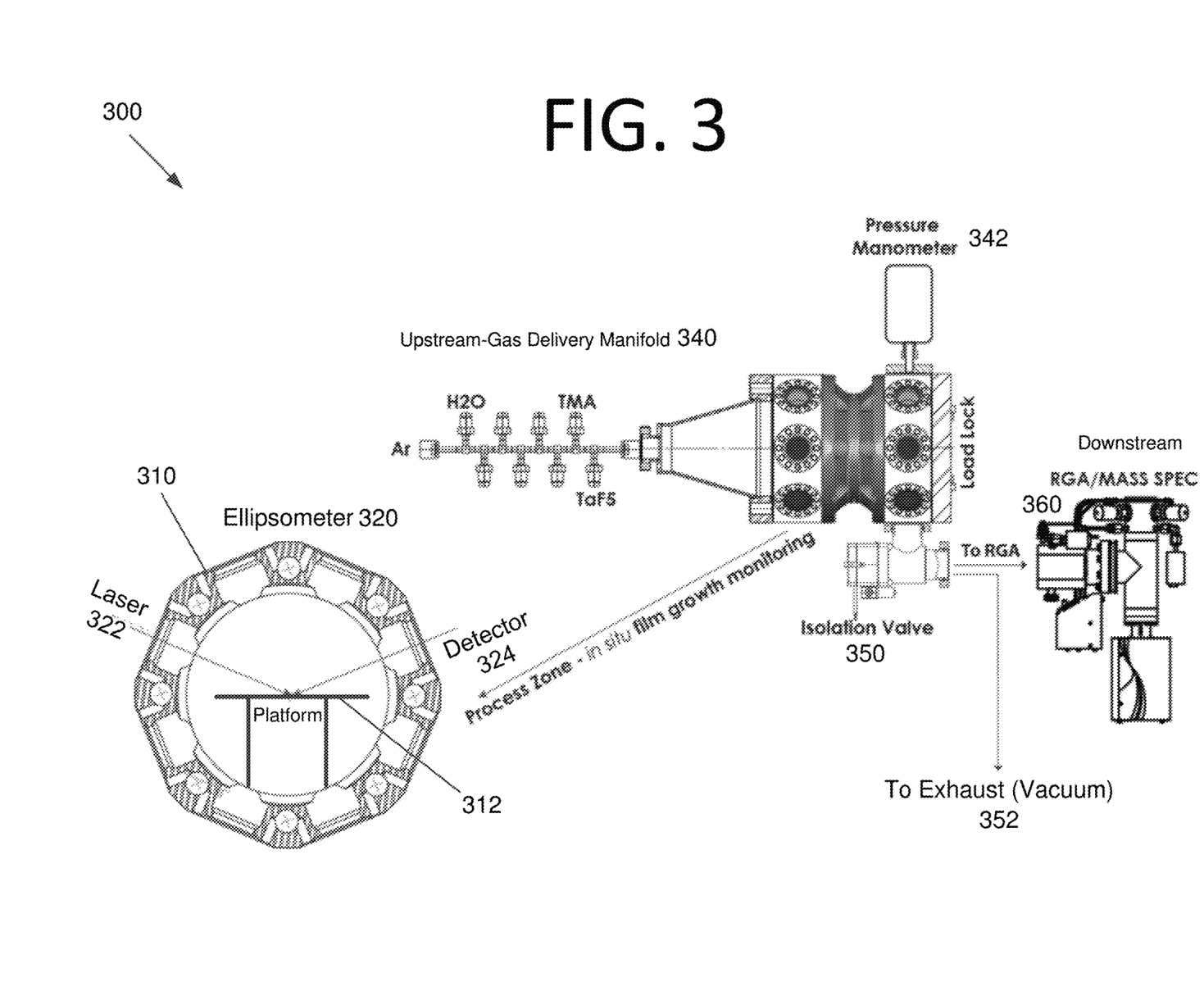
FIG. 3 is an architectural view of an ALD system, according to an embodiment of the present invention.

FIG. 3 is an architectural view of an ALD system 300, according to an embodiment of the present invention. ALD system 300 includes an ALD chamber 310 with a platform on which powder pigment can be thinly spread. However, this embodiment lacks a rotating drum, such as rotating drum 220 of FIG. 2A. As such, powder pigment may need to be moved/agitated in order to more effectively coat its particles, and the coating process may be less efficient.

Similar to ALD 200 of FIGS. 2A and 2B, ALD system 300 includes an ellipsometer 320 that includes a laser 322 and a detector 324 and a downstream residual gas analyzer (RGA) and mass spectrometer 360. An upstream gas delivery manifold 340 delivers the various gases (and potentially liquids) that may be desired (e.g., Ar, $H_2O$, TMA (please define), tantalum pentafluoride ($TaF_5$), etc.). A pressure manometer 342 measures pressure for gas delivery manifold 340. An isolation valve 350 isolates a vacuum 352 from ALD chamber 310. Vacuum 352 maintains reduced pressure or vacuum conditions inside ALD chamber 310 and pumps gases out of ALD chamber 310 when vacuum 352 is running and isolation valve 350 is open.

Figure 4:
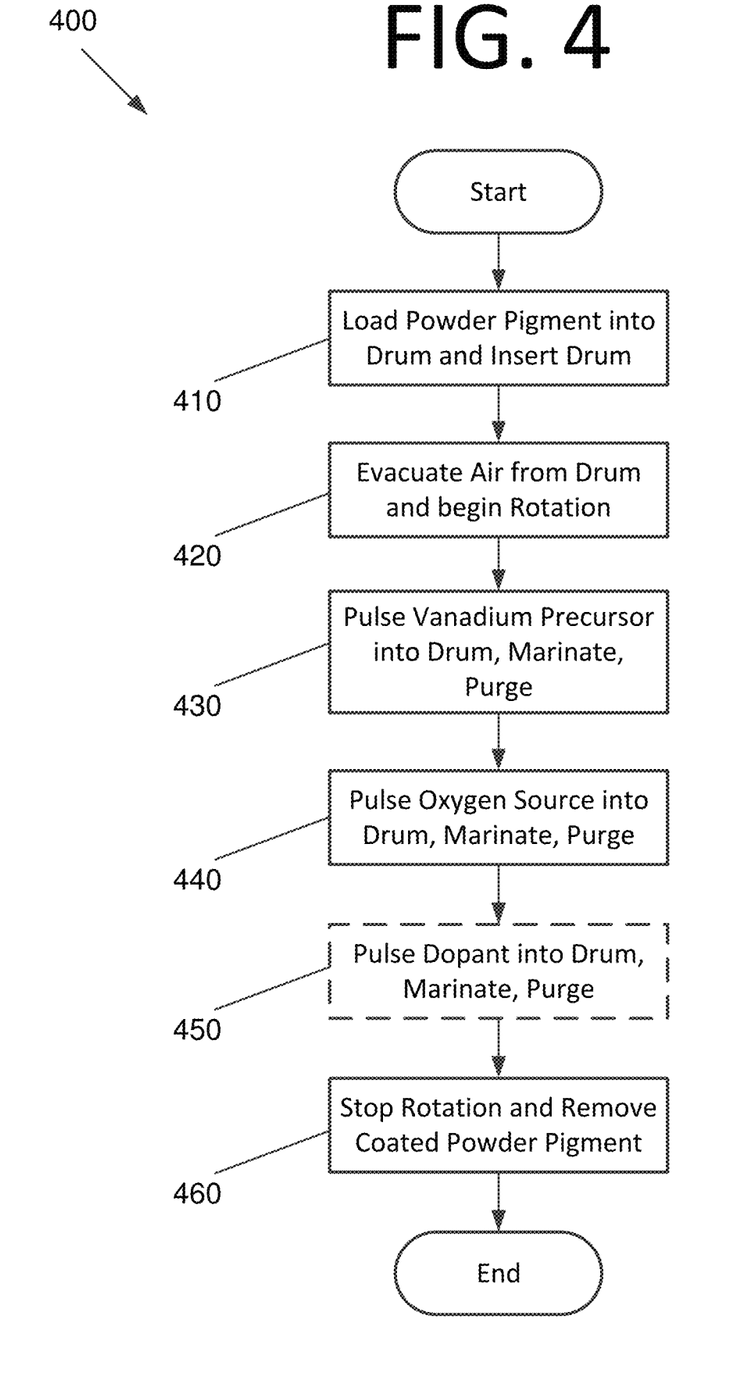
FIG. 4 is a flowchart illustrating a process for applying a thermal protective coating to pigment particles, according to an embodiment of the present invention.

FIG. 4 is a flowchart illustrating a process 400 for applying $VO_2$ to pigment particles, according to an embodiment of the present invention. The process begins with loading powder pigment, such as a silicate pigment, into a rotating drum, and then loading the rotating drum into a vacuum chamber, at 410. Air is then evacuated from the rotating drum using a vacuum and the drum begins rotation at 420. In some embodiments, the drum may be rotated at varying speeds during the process.

A liquid vanadium precursor is pulsed into the rotating drum, marinated for a first time period $t_1$, and purged at 430.

An oxygen source (e.g., ozone) is then pulsed into the rotating drum, marinated for a second time period $t_2$ to complete the $VO_2$ stoichiometry, and purged at 440. In embodiments where doping of the $VO_2$ is desired, a dopant (e.g., tungsten, niobium oxide, etc.) is pulsed into the rotating drum, marinated for a third time period $t_3$, and then purged at 450.

In some embodiments, the first time $t_1$, the second time $t_2$, and/or the third time $t_3$ may be the same. By varying the pulse sequence, or repeating $t_1$-$t_2$, $t_1$-$t_2$-$t_3$, etc., emissivity and/or state change temperature of the overall film structure can be controlled. This combination of precursors has never been used before. Drum rotation is then stopped and the now coated powder pigment is then removed from the rotating drum at 460. The powder pigment is then ready to be mixed and applied as a radiator.

In general terms, how long each pulse is left in the rotating drum, how many pulses are used, and how quickly the drum rotates depends on the chemistries of the substrate (i.e., pigment) and the resultant properties that are desired. In some embodiments, each pulse may be on the order of 1-3 seconds, and the gas may have a residence time in the rotating drum on the order of 20-30 seconds, followed by a 1-minute purge. The rotation speed of the drum may also be pigment-related. In some embodiments, the drum rotates at 30-60 rotations per minute (RPM). However, any pulse length, amount of gas, drum size and shape, residence time in the rotating drum, and/or purge time may be used without deviating from the scope of the invention.

Figure 5:
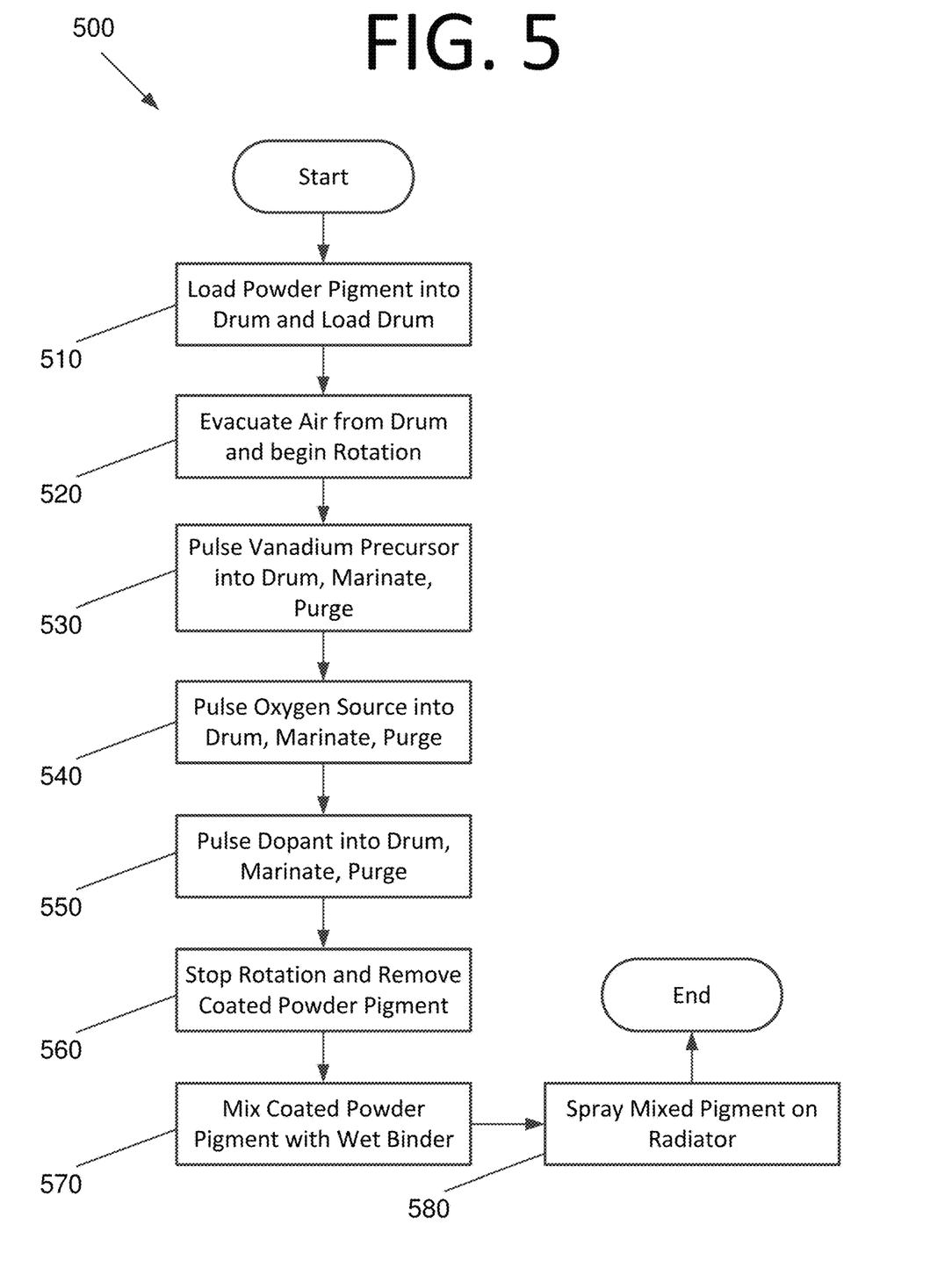
FIG. 5 is a flowchart illustrating a process for applying doped $VO_2$ to pigment particles, according to an embodiment of the present invention.

FIG. 5 is a flowchart illustrating a process 500 for applying doped $VO_2$ to pigment particles, according to an embodiment of the present invention. The process begins with loading powder pigment into a rotating drum and loading the rotating drum into a vacuum chamber of an ALD reactor at 510. Air is evacuated from the rotating drum and rotation of the rotating drum begins at 520.

A liquid vanadium precursor (e.g., tetrakis(ethylmethylamino) vanadium (TEMAV)) is pulsed into the rotating drum with a sufficiently low vapor pressure that the vanadium precursor vaporizes in the rotating drum, the powder pigment is marinated with the vaporized vanadium precursor for a first time period, and then the vaporized vanadium precursor is purged at 530. An oxygen source (e.g., ozone) is pulsed into the rotating drum, the powder pigment coated with the vaporized vanadium precursor is marinated for a second time period, and the oxygen precursor is purged at 540. A dopant (e.g., tungsten, niobium oxide, or both) is pulsed into the rotating drum, the $VO_2$ coated powdered pigment is marinated for a third time period, and the dopant is purged at 550. This results in a doped coating of $VO_2$ on particles of the powder pigment.

Drum rotation is then stopped and the now coated powder pigment is then removed from the rotating drum at 560. The coated powder pigment is then mixed with a wet binder at 570 and sprayed on a radiator at 580, forming a film of the mixed pigment on the radiator. Once the radiator dries, it is then ready to be used for a space vehicle or any other suitable application without deviating from the scope of the invention.

In some embodiments, the rotating drum is rotated at varying speeds during the coating process. In certain embodiments, the pulsing of the liquid vanadium precursor step, the pulsing of the oxygen source step, and the pulsing of the dopant step are repeated one or more times. In some embodiments, the first time period, the second time period, the third time period, or any combination thereof, are varied in order to achieve a predetermined emissivity, a predetermined state change temperature, or both.

In some embodiments, the doped $VO_2$ changes from a semiconductor crystalline structure to a metal crystalline structure at a temperature of less than 68° C. In certain embodiments, the doped $VO_2$ changes from a semiconductor crystalline structure to a metal crystalline structure at a temperature of greater than or equal to 0° C. In some embodiments, each pulse is 1-3 seconds, the first time period, the second time period, or both, are 20-30 seconds, and the purges are approximately one minute. In certain embodiments, the rotating drum rotates at 30-60 RPM.

It will be readily understood that the components of various embodiments of the present invention, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A method, comprising:
    loading powder pigment into a rotating drum and loading the rotating drum into a vacuum chamber of an atomic layer deposition (ALD) reactor;
    evacuating air from the rotating drum and beginning rotation of the rotating drum;
    pulsing a liquid vanadium precursor into the rotating drum with a sufficiently low vapor pressure that the vanadium precursor vaporizes in the rotating drum, marinating the powder pigment with the vaporized vanadium precursor for a first time period, and then purging the vaporized vanadium precursor; and
    pulsing an oxygen source into the rotating drum, marinating the powder pigment coated with the vaporized vanadium precursor for a second time period, and purging the oxygen precursor, resulting in a coating of $VO_2$ on particles of the powder pigment.

2. The method of claim 1, wherein the rotating drum is rotated at varying speeds during the coating process.

3. The method of claim 1, wherein the oxygen source comprises ozone.

4. The method of claim 1, wherein the liquid vanadium precursor comprises tetrakis(ethylmethylamino) vanadium (TEMAV).

5. The method of claim 1, further comprising:
    pulsing a dopant into the rotating drum, marinating the $VO_2$ coated powdered pigment for a third time period, and purging the dopant.

6. The method of claim 5, wherein the dopant comprises tungsten, niobium oxide, or both.

7. The method of claim 5, wherein the pulsing of the liquid vanadium precursor step, the pulsing of the oxygen source step, and the pulsing of the dopant step are repeated one or more times.

8. The method of claim 5, wherein the first time period, the second time period, the third time period, or any combination thereof, are varied in order to achieve a predetermined emissivity, a predetermined state change temperature, or both.

9. The method of claim 5, wherein the doped $VO_2$ changes from a semiconductor crystalline structure to a metal crystalline structure at a temperature of less than 68° C. that is defined based on application requirements.

10. The method of claim 9, wherein the doped $VO_2$ changes from a semiconductor crystalline structure to a metal crystalline structure at a temperature of greater than or equal to 0° C.

11. The method of claim 1, further comprising:
    mixing the coated powder pigment with a wet binder; and
    spraying the mixed pigment on a radiator, forming a film of the mixed pigment on the radiator.

12. The method of claim 1, wherein
    each pulse is 1-3 seconds,
    the first time period, the second time period, or both, are 20-30 seconds, and
    the purges are approximately one minute.

13. The method of claim 1, wherein the rotating drum rotates at 30-60 rotations per minute (RPM).

14. A method, comprising:
    pulsing a liquid vanadium precursor into a rotating drum under vacuum conditions, the liquid vanadium precursor having a sufficiently low vapor pressure that the vanadium precursor vaporizes in the rotating drum, marinating the powder pigment with the vaporized vanadium precursor for a first time period, and then purging the vaporized vanadium precursor; and
    pulsing an oxygen source into the rotating drum, marinating the powder pigment coated with the vaporized vanadium precursor for a second time period, and purging the oxygen precursor, resulting in a coating of $VO_2$ on particles of the powder pigment.

15. The method of claim 14, further comprising:
    pulsing a dopant into the rotating drum, marinating the $VO_2$ coated powdered pigment for a third time period, and purging the dopant.

16. The method of claim 15, wherein the pulsing of the liquid vanadium precursor step, the pulsing of the oxygen source step, and the pulsing of the dopant step are repeated one or more times.

17. The method of claim 15, wherein the doped $VO_2$ changes from a semiconductor crystalline structure to a metal crystalline structure at a temperature of less than 68° C. that is defined based on application requirements.

18. The method of claim 14, wherein
    each pulse is 1-3 seconds,
    the first time period, the second time period, or both, are 20-30 seconds, and
    the purges are approximately one minute.

19. A method, comprising:
    pulsing a liquid vanadium precursor into a rotating drum under vacuum conditions, the liquid vanadium precursor having a sufficiently low vapor pressure that the vanadium precursor vaporizes in the rotating drum, marinating the powder pigment with the vaporized vanadium precursor for a first time period, and then purging the vaporized vanadium precursor;
    pulsing an oxygen source into the rotating drum, marinating the powder pigment coated with the vaporized vanadium precursor for a second time period, and purging the oxygen precursor; and
    pulsing a dopant into the rotating drum, marinating the $VO_2$ coated powdered pigment for a third time period, and purging the dopant, resulting in a doped coating of $VO_2$ on particles of the powder pigment that changes from a semiconductor crystalline structure to a metal crystalline structure at a temperature of less than 68° C. that is defined based on application requirements.

20. The method of claim 19, wherein the first time period, the second time period, the third time period, or any combination thereof, are varied in order to achieve a predetermined emissivity, a predetermined state change temperature, or both.

* * * * *